United States Patent [19]

Paltiel

[11] Patent Number: 4,644,280
[45] Date of Patent: Feb. 17, 1987

[54] MAGNETIC RESONANCE IMAGE ZOOMING
[75] Inventor: Zvi Paltiel, Rehovot, Israel
[73] Assignee: Elscint Ltd., Haifa, Israel
[21] Appl. No.: 652,462
[22] Filed: Sep. 20, 1984
[51] Int. Cl.⁴ .......................................... G01R 33/20
[52] U.S. Cl. ..................................... 324/309; 324/307
[58] Field of Search ............... 324/300, 307, 309, 312, 324/313, 314

[56] References Cited
U.S. PATENT DOCUMENTS
4,290,019 9/1981 Hutchison ........................ 324/311
4,480,228 10/1984 Bottomley ........................ 324/307

Primary Examiner—Michael J. Tokar
Attorney, Agent, or Firm—Sandler & Greenblum

[57] ABSTRACT

A slice selection arrangement for MRI systems uses a psuedo-spin echo procedure by applying a 90 degree RF pulse in the presence of gradient pulse, applied in the direction of the encoding pulses; applying the 180 degree RF pulse in the presence of a gradient in another orthogonal direction and reading out the echo in the presence of the third orthogonal gradient pulse. Aliasing artifacts are avoided even though the section imaged is smaller than the object size, allowing zooming and/or a reduced number of encoding cycles for single slice imaging.

23 Claims, 6 Drawing Figures

MAGNETIC RESONANCE IMAGE ZOOMING

FIELD OF INVENTION

This invention is concerned with Magnetic Resonance Imaging ("MRI") methods and more particularly to improvements in the MRI technique generally know as "Spin Echo Data Acquisition".

BACKGROUND OF THE INVENTION

One of the data gathering methods presently used for MRI is known as the "Spin-Echo" method. In this method, as in the other MRI methods the object or subject is placed into a strong static magnetic field to align its normally random "Spins" (nuclei exhibiting magnetic moments) with the magnetic field to form a "spin or magnetic vector". Radio frequency pulses at Larmor frequencies are used to change the state (i.e. the magnetic alignment) of these "spins" and the free induction decay ("FID") signals brought about by the return of the spins to the aligned state corresponding to the strong static magnetic field are used for generating the image. The Larmor frequency signals are transmitted during the imposition of gradient pulses to enable determining the location of the sources of the FID signals in the subject being imaged. Thus, facilities are available for applying magnetic gradients in "X", "Y" and "Z" orthogonal directions.

In the "Spin Echo" method, a pulsed magnetic field rotating at the Larmor frequency is first applied to nutate the spin vectors 90 degree from the aligned position (hereinafter "a 90 degree RF pulse"). When the spins or vectors are 90 degrees away from the aligned position, they characteristically dephase. In effect, in the frame of the rotating field the magnetic vector dephases into a plurality of vectors rotating about the axis of the the strong magnetic field in clockwise and counter-clockwise directions simultaneously. Certain of the vectors rotate faster then others. A second pulsed magnetic field is applied to now nutate the spins 180 degrees, (hereinafter "a 180 degree RF pulse"). An echo is obtained a certain time period after the spins are nutated 180 degrees. The 180 degree nutation provides a mirror-like reflection of the dephasing spin vectors. In the frame of the rotating field, the nutated spin-vectors continue to rotate in their respective clockwise and counter clockwise directions; thus, the faster dephasing vectors catch up with the slower dephasing vectors and there is a refocusing of the spins at a time Ta equal to the time Ta between the aforementioned 90 degree RF pulse and the 180 degree RF pulse.

Presently the spin-echo method is accomplished by applying the 90 degree RF pulse during the application of a gradient pulse, such as a "Z" gradient pulse, for example. Subsequently, the 180 degree RF pulse is applied at a time Ta after the 90 degree RF pulse and also during the application of a similar pulse of the same gradient. The application of the gradients results in a selection of a specific slice in the subject to be imaged.

Encoding gradient pulses such as for example "Y" gradient pulses, are applied for example, between the transmission of the 90 degree and the 180 degree RF pulses. A third gradient such as an "X" gradient read pulse is applied after the application of the 180 degree RF pulse. It is during the read pulse that the echo is received. Several echos can be obtained by applying subsequent 180 degree pulses with slice selecting gradient pulses and gradient read pulses during the echo acquisitions after time periods Ta until the echo is too small to provide a meaningful reading. This procedure gives an image in a slice or a plane.

The plane is selected by the choice of the slice selecting gradient. Thus, when a "Z" slice selecting gradient is used, which conventionaly is a gradient in the direction of the large static magnetic field, a plane normal to the large static magnetic field is selected. As used herein, the "X" and "Y" coordinates are orthogonal to the direction of the large static magnetic field with "Y" in the direction of the encoding pulses and "X" in the direction of the reading pulse.

Appropriate permutation of the roles of the gradients enables the imaging of slices facing other directions as well. The encoding and the read gradient can be interchanged within the scope of the invention.

In imaging, in general, the scientists are always endeavoring to increase the spatial resolution and lower the time required to provide the image. These are contrary aims; that is decreasing the time generally decreases the resolution. Thus, a method for decreasing the time while maintaining the same resolution or a method for increasing the resolution while imaging during the same time period is highly desirable. In MR imaging, increasing the time of acquiring an image does not pose any danger to the patient because there is no dangerous radiation being used; nonetheless, since throughput is an important consideration economically, clinicians and imaging scientists are always interested in decreasing the time required for acquiring images. In some cases the time saved might be used for accumulating of several images of the same slice and subsequent averaging resulting in an increase in the signal-to-noise ratio.

A further goal desired by imaging scientists is to be able to zoom during the acquisition stage. In other words, during the imaging process if a particular portion of the body shows an interesting manifestation; it is often desirable to zoom in on this manifestation and to thereby focus on the manifestation to the exclusion of other data. This is presently accomplished in MRI systems as a computer step after the acquisition of the data, if the imaging is to be accomplished within the same time frame. However no increase of the spatial resolution can be achieved by such manipulation of the data. It would be desirable to be able to zoom during the acquisition of data. Such zooming would increase the resolution of the portion of the image focused upon in a natural manner. A prior art problem encountered when zooming during the acquisition of data is that "aliasing" artifacts are generated unless the number of encoding cycles is increased with a proportional increase of the total acquisition time. Aliasing is basically caused by undersampling. Thus, focusing on a smaller section of the body being imaged while using the samplings of the larger image results in aliasing artifacts.

Accordingly, an object of this invention is to provide improved slice selection for MRI systems using spin-warp echoing data acquisition and two dimensional Fourier transform data processing imaging techniques. A synergistic advantage of the slice selection method is that controlled zooming is provided during the data acquisition process substantially without aliasing artifacts.

Accordingly, an improved slice selection method for magnetic resonant imaging systems is provided, said method including the step of:

obtaining images substatially free of aliasing artifacts even while reducing the extent of the image slice in the encoding direction below the size of the object.

A feature of the present invention is the application of the system to provide zooming during data acquisition rather then relying on after-acquisition data manipulation.

A further feature of the invention provides for applying the 90 degree RF pulse in the spin-warp echo technique while a gradient pulse is applied in the encoding direction as opposed to a gradient pulse being applied in the slice selection direction. A 180 degree RF pulse is subsequently applied during the application of a slice selecting gradient pulse. Alternatively, the slice selecting gradient is applied during the 90 degree RF pulse, and the 180 degree RF pulse is applied while a pulse in the encoding direction is applied. A read gradient pulse orthogonal to both slice selection direction and the encoding direction is applied during the echo pulse.

BRIEF DESCRIPTION OF THE DRAWINGS

The above named and other features and objects of the present invention will be best understood when considered in the light of the following description of a preferred embodiment of the invention made in conjuction with the accompanying drawings; wherein.

GENERAL DESCRIPTION

Figure 1:
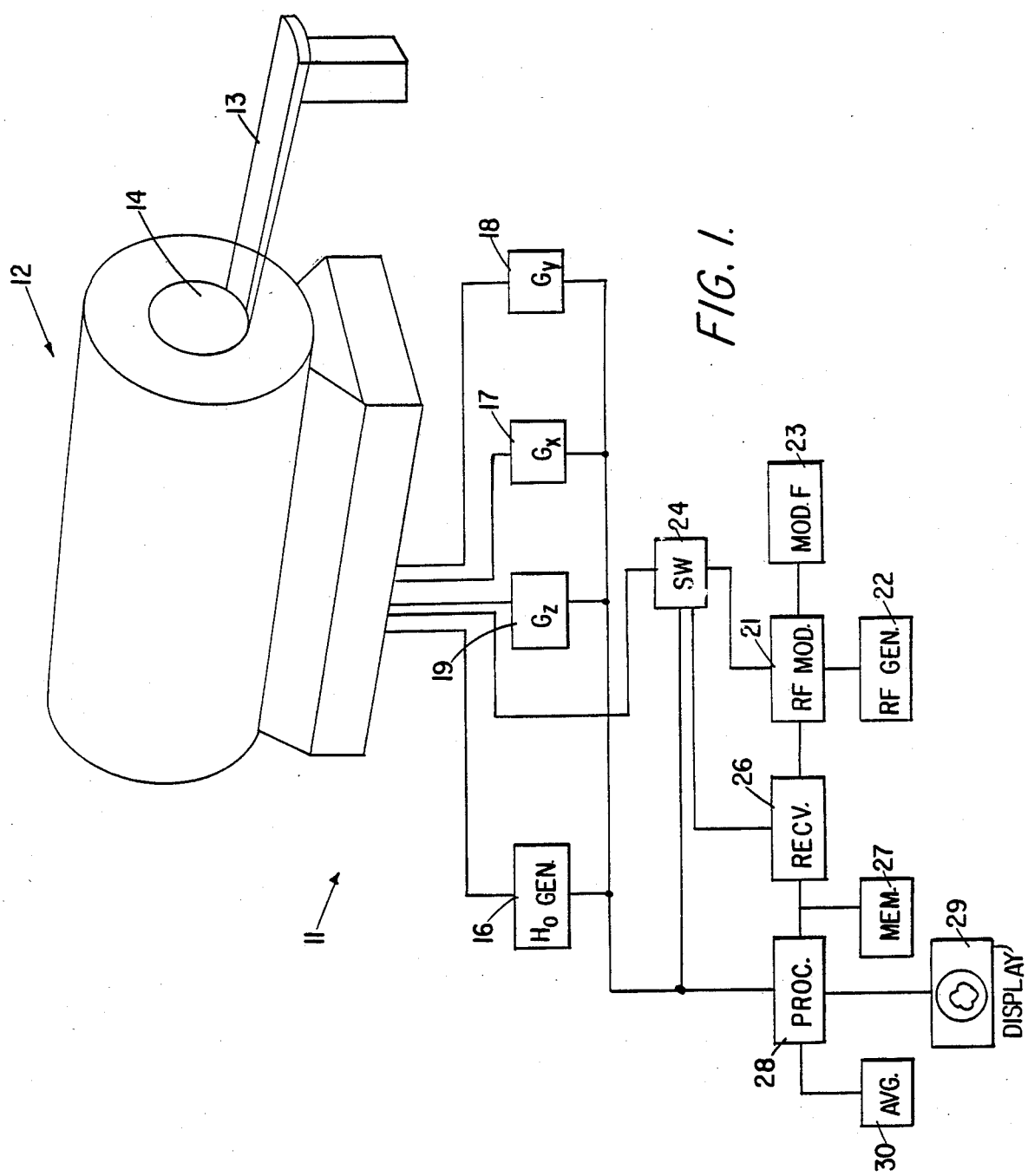
FIG. 1 is a combined pictorial block diagram of an MRI system.

The MRI system 11 of FIG. 1 includes a magnet assembly shown generally at 12 and a bed 13 on which the patient is brought into the tunnel 14 of the magnet assembly 12. The magnet assembly 12 comprises the static magnet powered by magnetic field generator 16 and gradient magnetic field generators for providing gradients in the "X" "Y" and "Z" directions, shown as the "X" magnetic gradient generator 17, the "Y" magnetic gradient generator 18 and the "Z" magnetic gradient generator 19, respectively.

In addition not shown are transmitting and receiving coils for transmitting the Larmor frequency pulses and for receiving the FID signals. Often these coils are the same. These coils are supplied with energy in the transmision mode by the radio frequency modulator 21 which in turn receives its carrier frequency signals and modulating frequency signals from radio frequency generator 22 and the modulating frequency generator 23, respectively.

A switch 24 is used to enable using the same coils in both receiving and transmitting modes. When the switch is in the receiving mode the signal is received from the coils by receiver 26 and transmitted to memory 27 or through processor 28 to display unit 29.

The processor 28 also controls the timing and amplitudes of the signals necessary for the imaging. In addition since the method enables imaging in less time an averaging circuit 30 is provided, controlled by the processor to enable accumulating and averaging images to improve the signal-to-noise ratio.

Figure 2A:
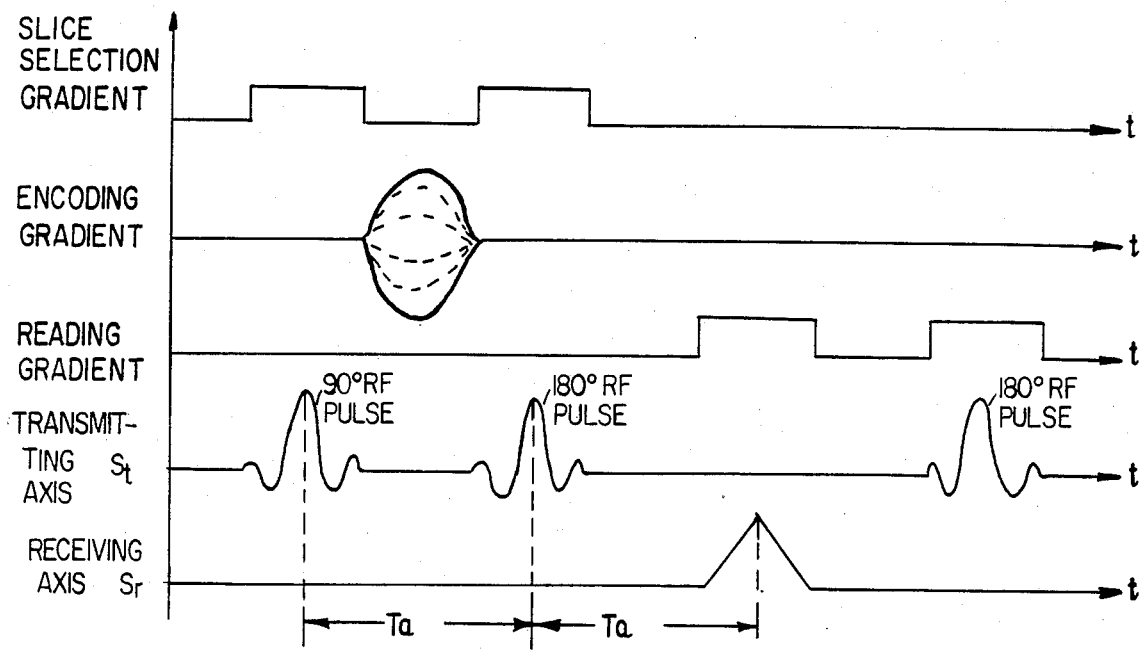
FIG. 2a is a gradient and RF pulse sequence chart for a prior art MRI system using spin-warp echoing in acquiring images.

The signal sequence necessary for generating spin-warp echo signals used in the prior art is shown in FIG. 2a. It should be noted therein that the 90 degree RF pulse is transmitted during the transmission of a slice selecting gradient pulse. This RF pulse shifts or nutates the spins 90 degree from the direction of the static magnetic field to a plane normal to the static magnetic field. The transmitted RF pulses are shown on the transmitting axis labelled "$S_t$".

Encoding gradient pulses of varying amplitudes are applied subsequent to the application of the 90 degree RF pulse. It should be noted that there are other pulses applied for countering magnetic effects not desired or required. For purposes of avoiding confusion these "other" pulses are not shown in the pulse sequence of FIG 2.

As is well known, in the frame of the field rotating at the RF (Larmor) frequency, the 90 degree shifted spins start to dephase or defocus. Consequently, in this rotating frame there are magnetic vectors that are rotating away from the 90 degree shifted spins in both the clockwise and counterclockwise direction. At a time Ta after the application of the 90 degree pulse there are magnetic vectors which are further away from the 90 degree shifted spins then others. At this time Ta a 180 degree RF pulse is applied along with another slice selecting gradient pulse. The 180 degree RF pulse shifts the defocusing spin vectors 180 degrees in a manner so that the vectors now move toward a central position rather than away from the central position, Thus the faster moving vectors which are further from the central position overtake the slower moving ones and the spins reunite or "refocus" to generate the echo pulse. The echo pulse sampling period is shown on the receiving axis labeled Sr. The actual echo pulse signal is readout during the application of a read gradient pulse and occurs during the sampling period.

Using this method image data is acquired of an area of the selected plane determined by the encoding gradient and the read gradient. The data is preferably processed using the well known two dimensional Fourier Transforms. The area is defined by the amplitude and slope of the gradient pulses, and the time duration and sampling time intervals of the echo pulses. The area is in a plane determined by the slice selecting gradient.

Figure 3A:
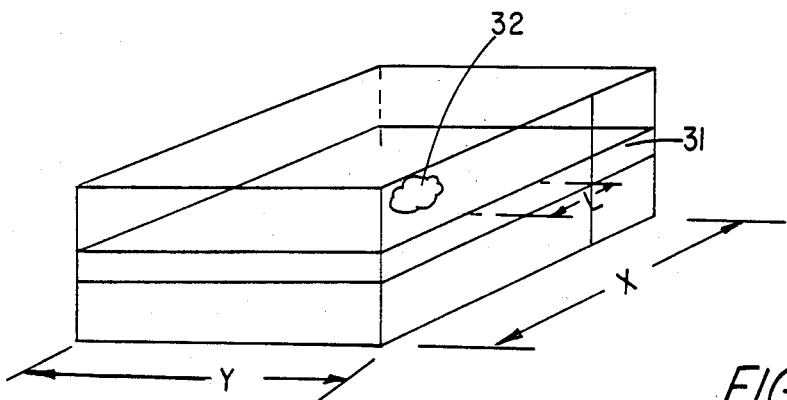
FIG. 3a is a three dimensional view of the imaged plane.
Figure 4:
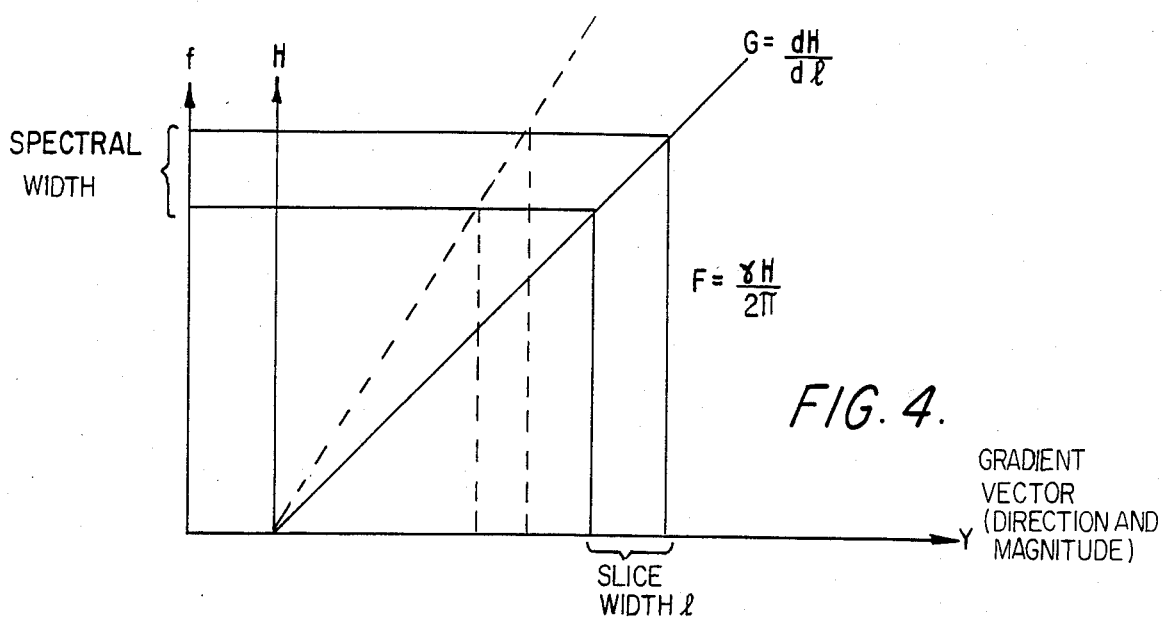
FIG. 4 is a graphical showing of the relation of the spectral interval of the RF pulse to the slice position and width as a function of the slope of the magnetic gradient.

FIG. 3a shows the plane 31 that is imaged using the pulsing prodecure of FIG. 2a. The slice selecting gradient is a "Z" gradient, the encoding gradient is a "Y" gradient and the read gradient is an "X" gradient. As shown in FIG. 4 the slope of the gradient and the spectral width of the echo signals cooperate to provide the data for imaging the entire slice. Filters (not shown) may be used to limit the image to a portion of the slice shown as "L". In the "X" direction where the data is acquired on an analog basis, the filtering may be done with analog filters, with digital filters, or by combined analog and digital filters. Since the data is acquired on an analog basis there are no aliasing problems due to insufficient sampling until processing occurs to convert the analog data to digital data by sampling, for example. Assume that the actual region of interest for the clinician is shown in FIG. 3a by the area 32 in the object. Using the prior art techniques, if an attempt is made to zoom in on area 32 of the image during the image data acquistion process without the proper increase in the number of encoding cycles artifacts will result because of the small number of sampling points. Accordingly, zooming has been done either by taking more time, i.e., using more encoding pulses or by reconstruction and computer techniques such as interpolation to provide additional sampling data.

Resolution in MRI in the encoding direction, delta "Y", is equal to the field of view divided by the number of cycles of encoding amplitude changes; where encoding is defined as the differences in gradient amplitude integrated over its duration i.e. is proportional to approximatly one over the area of the curves representing each encoding cycle. When the dimension "1" of the image is less then or equal to the number of cycles multiplied by delta "Y" so that "1" is smaller than the field of view (defined by "Y" in FIG 3a) then there are no aliasing problems. However, if "1" in FIG. 3a is greater then the number of cycles times delta "Y" (so that "1" is larger than the field of view) then there are aliasing problems. The aliasing problems are inherent in the encoding direction due to the discrete manner of accumulating data in that direction.

Figure 2B:
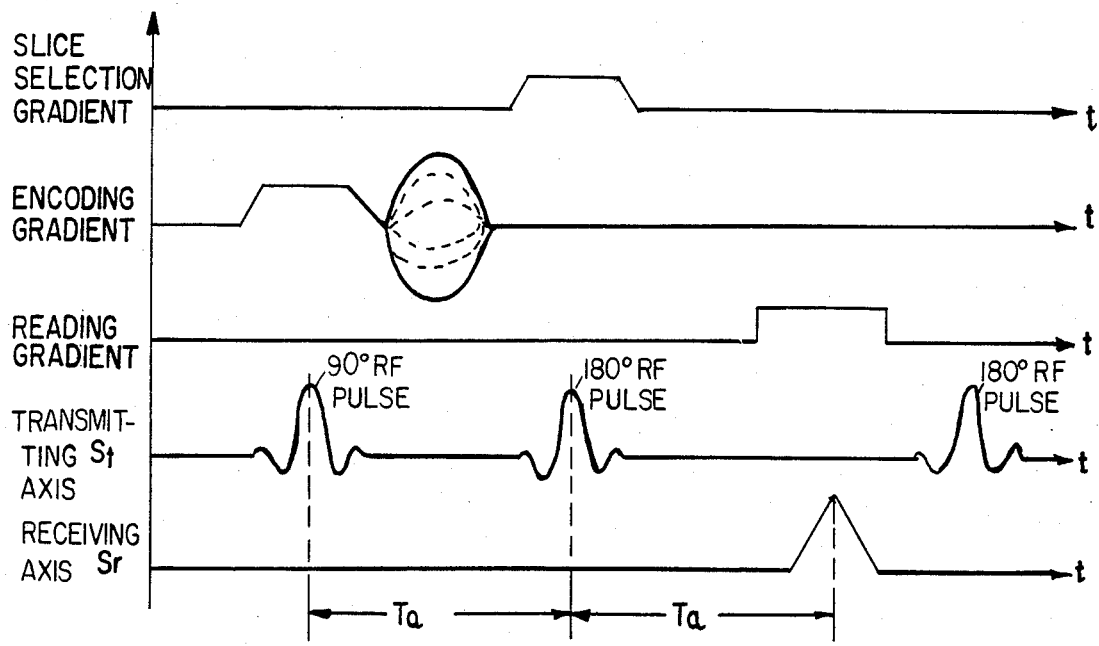
FIG. 2b is an example of the gradient and RF pulse sequence used according to the present invention.

The inventive method overcomes these aliasing problems without requiring more imaging time by using a new sequence for the spin-warp image data acquisition procedure. As shown in FIG. 2b the 90 degree RF pulse is transmitted as shown on the transmitting axis $S_t$ during the transmittal of a first gradient pulse in the direction of the encoding gradient pulse instead of in the direction of a slice selection gradient pulse. The spectral width of the gradient pulse is selected to provide the width of the field of view necessary to generate the desired zoomed image. More particularly, a spectral width is equivalent to a gradient pulse according to the Larmor equation. Therefore a spectral width on the frequency axis f or the gradient axis H results in a slice width "l" in the direction of the gradient; i.e. along the Y axis. The spectral location of the first gradient pulse determines the location of the strip having the desired width. The location is selected to center the field of view where the clinician wants to examine the object (alternatively one might use the 180 degree RF pulse for that purpose). Both the width and the location of the field of view in say the Y direction are controlled by choosing a spectral width and location, and consequently a gradient slope range.

Figure 3B:
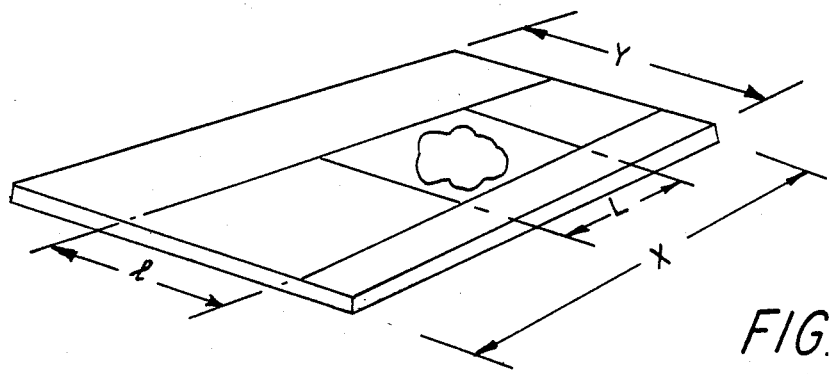
FIG. 3b is a plan view of the imaged plane.

Subsequent to the first pulse, a gradient encoding pulse ("Y" gradient in this example) is applied. Subsequent to a time period Ta after the transmission of the 90 degree pulse, a 180 degree RF pulse is transmitted. During the transmission of the 180 degree pulse, a gradient slice selecting pulse is applied. A read gradient pulse is applied to assure that the echo which peaks at time period Ta after the 180 degree pulse is received during the read gradient pulse, as shown on axis Sr. The image obtained is shown in FIG. 3b where the width "1" defines the field of view rather then the width "Y". However aliasing problems do not occur because no echo can come from the areas not within the width "1". Thus it is possible to select just the area located within the area defined by "1" times "L" of FIG. 3b rather than the area comprised of the entire "Y" dimension times "L" of FIG. 3a. Since the field of view l is smaller then the entire Y dimension it is possible to either use less encoding cycles for the same resolution and thereby acquire the image faster or to use more encoding cycles during the same amount of time but because of the smaller area to improve the resolution. Therefore, either the image resolution can be improved or time of acquisition can be shortened or a combination of both can be accomplished using the method described herein.

Note that the resolution (R) is equal to the field of view (FOV) divided by the number of lines of encoding cycles. The FOV in the inventive arrangement is "1" which is also equal to the number of encoding cycles (N) multiplied by delta "Y". When Y<NΔY there are no aliasing problems. When Y>NΔY there are aliasing problems. Therefore in FIG. 3b 1/Y=N(MIN) and 1/N=(R) in the "Y" direction. The total acquistion time is proportional to the number of encoding cycles. Thus, if for example 1 is ¼ of the width Y than four images could be taken of the width 1 during the time period required for imaging the width Y. Therefore the resolution could be improved by using the time period that would be used for an image of the width Y or less time could be taken or a plurality of images could be accumulated and averaged and the S/N ratio could be raised or combinations of the above procedures could be used to improve the system performance.

Thus, in practice a patient is placed into tunnel 14 of the magnet having the large static field. Subsequently, thereto a 90 degree RF pulse at a Larmor frequency is applied during the application of a first gradient applied in the direction of the encoding gradient. The Larmor frequency is directly proportional to the field strength. Hence, when the echo signal is received during an applied read gradient the location of the echo source is exactly determined by the echo frequency.

At a time Ta after the application of the 90 degree pulse, a 180 degree pulse is applied, during the application of the slice selecting gradient pulse. After another time period Ta an echo pulse is received. During this pulse a read gradient is applied to read out the echo signal in the desired region of interest of the image. More echos can be read out through the application of more 180 degree RF pulses after time periods Ta pass. Thus sufficient data is acquired and the image is reconstructed using spin warp or two dimensional Fourier transform reconstruction procedures that are well known to those skilled in the art.

While the invention has been described using a particular embodiment it should be understood that these preferred systems are by way of example only and not as a limitation on the scope of the invention, which scope is defined by the accompanying claims.

What is claimed is:

1. An improved magnetic resonant imaging (MRI) method using a pseudo spin-echo technique, said method comprising the steps of:
   (a) applying a large static magnetic field to a subject to align the spins in said (object) subject;
   (b) nutating the aligned spins in a first slice with 90 degree RF pulses applied during the applications of first gradient pulses;
   (c) applying encoding gradient pulses subsequent to the application of the 90 degree RF pulses;
   (d) controllably dephasing said nutated aligned spins;
   (e) rephasing at least certain of the dephased nutated aligned spins in a second slice with 180 degree RF pulses applied during the application of second gradient pulses orthogonal to said first gradient pulses at times $T_a$ after the application of the 90 degree RF pulses; and (f) applying read gradient pulses orthogonal to both said first and said second gradients at times $T_a$ after the application of the 180 degree RF pulses to enable receipt of location determined echo signals from rephased ones of said dephased nutated spins whereby images are obtained from said signals in desired sections of the subject that are smaller than the subject size.

2. The imaging method of claim 1 wherein said step of controllably dephasing said nutated aligned spins comprises the step of:
applying said encoding gradient pulses in the direction of said first gradient.

3. The imaging method of claim 1 wherein said step of controllably dephasing said nutated aligned spins comprises the step of:
applying said encoding gradient in the direction of said second gradient pulses.

4. The imaging method of claim 1 including the step of:
controlling the thickness of said first slice by varying the spectral width of said 90 degree RF pulse and the slope of said first gradient.

5. The imaging method of claim 4 including the step of: controlling the location of said slice by varying the spectral location of said 90 degree RF signal and the slope of said first gradient.

6. The imaging method of claim 5 including the step of: controlling the thickness of said second slice by controlling the spectral width of said 180 degree RF pulse and the slope of the second gradient.

7. The imaging method of claim 6 including the step of: controlling the location of said second slice by controlling the spectral location of said 180 degree RF pulse and the slope of said second gradient; whereby the use of controlled locations and widths of orthogonal slices enables imaging a selected section of the slice of the subject with signals occuring only at the intersection of the selected slices to thereby exclude aliasing artifacts.

8. The imaging method of claim 7 wherein said first gradient is a "Y" gradient.

9. The imaging method of claim 8 wherein said step of controllably dephasing said nutated aligned spins comprises the step of applying an encoding gradient in the direction of the "Y" gradient.

10. The imaging method of claim 9 wherein said second gradient is a "Z" gradient.

11. The imaging method of claim 10 including the steps of:
accumulating several images of the same sections in the time period previously used for one image and averaging said several images to increase the signal to noise ratio in the image.

12. An improved MRI system for using a spin-echo technique, said system comprising:
(a) means for applying a large static magnetic field to a subject to align the spins in said subject;
(b) means for nutating the aligned spins in a first slice with 90 degree RF pulses applied during the applications of first gradient pulses;
(c) means for applying encoding gradient pulses subsequent to the application of the 90 degree RF pulses;

(d) means for controllably dephasing said nutated aligned spins;
(e) means for rephasing at least certain of said dephased nutated aligned spins in a second slice with 180 degree RF pulses applied during the applications of second gradient pulses, orthogonal to said first gradient pulses at times $T_a$ after the applications of the 90 degree RF pulses; and
(f) means for applying read gradient pulses orthogonal to both said first and second gradient pulses, said read gradient pulses existing at times $T_a$ after the applications of the 180 degree RF pulses to enable receipt of location determined echo signals from rephased ones of said controllably dephased nutated spins whereby images are obtained from said signals in desired sections of the subject that are smaller than the subject size.

13. The imaging system of claim 12 wherein said means for controllably dephasing said nutated aligned spins comprises:
means for applying said encoding gradient pulses in the direction of said first gradient.

14. The imaging system of claim 12 wherein said means for controllably dephasing said nutated aligned spins comprises:
means for applying said encoding gradient pulses in the direction of said second gradient.

15. The imaging mehtod of claim 12 including means for controlling the thickness of said first slice by varying the spectral width of said 90 degree RF pulses and the slope of said first gradient pulses.

16. The imaging system of claim 15 including means for controlling the location of said slice by varying the spectral location of said 90 degree RF pulses and the slope of said first gradient pulses.

17. The imaging system of claim 16 including means for controlling the thickness of said second slice by controlling the spectral width of said 180 degree RF pulses and the slope of the second gradient pulses.

18. The imaging system of claim 17 including means for controlling the location of said second slice by controlling the spectral location of said 180 degree RF pulses and the slope of said second gradient pulses; whereby the use of controlled locations and widths of orthogonal slices enables imaging a selected section of the slice of the subject with echo signals occuring only at the intersection of the selected slices to thereby exclude aliasing artifacts.

19. The imaging system of claim 18 wherein said first gradient pulses are "Y" gradient pulses.

20. The imaging system of claim 19 wherein said step of selectively dephasing said nutated aligned spins comprises the step of applying said encoding gradient pulses in the direction of the "Y" gradient.

21. The imaging system of claim 20 wherein said second gradient pulses are "Z" gradient pulses.

22. The imaging system of claim 21 including:
means for accumulating several images of the same sections in the time period previously used for one image, and
means for averaging said several images to increase the signal-to-noise ratio in the image.

23. The imaging system of claims 12 and means for shifting the image obtained in both encoding and reading directions to locate the center of the image at the center of a display screen.

* * * * *